(12) United States Patent
Shan et al.

(10) Patent No.: US 10,122,346 B2
(45) Date of Patent: *Nov. 6, 2018

(54) COEFFICIENT GENERATION FOR DIGITAL FILTERS

(71) Applicant: SYNAPTICS INCORPORATED, San Jose, CA (US)

(72) Inventors: Peijun Shan, Westford, MA (US); David Sobel, Los Altos, CA (US); Stephen L. Morein, San Jose, CA (US)

(73) Assignee: SYNAPTICS INCORPORATED, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/449,875

(22) Filed: Mar. 3, 2017

(65) Prior Publication Data

US 2018/0254768 A1    Sep. 6, 2018

(51) Int. Cl.
*H03H 17/06* (2006.01)
*G06F 5/01* (2006.01)

(52) U.S. Cl.
CPC ............ *H03H 17/06* (2013.01); *G06F 5/01* (2013.01)

(58) Field of Classification Search
CPC ............ H03M 17/0227; H03M 17/06; H03M 17/0607
See application file for complete search history.

(56) References Cited

U.S. PATENT DOCUMENTS

| 5,257,026 A | 10/1993 | Thompson et al. |
| 9,488,545 B2 | 11/2016 | Rice et al. |
| 2008/0013747 A1 | 1/2008 | Tran |
| 2017/0242502 A1 | 8/2017 | Gray et al. |

*Primary Examiner* — Chuong D Ngo
(74) *Attorney, Agent, or Firm* — Paradice and Li LLP

(57) ABSTRACT

An example circuit includes: a filter configured to process a digital signal through at least one stage; and a coefficient generator circuit configured to generate coefficients for the at least one stage of the filter. The coefficient generator circuit includes: a lookup-table (LUT) configured to output a differential sequence; an up-sampling holder circuit configured to up-sample and hold the differential sequence to generate an up-sampled differential sequence; and an accumulator configured to integrate the up-sampled differential sequence to generate the coefficients.

20 Claims, 8 Drawing Sheets

COEFFICIENT GENERATION FOR DIGITAL FILTERS

BACKGROUND

Field of the Disclosure

Embodiments of disclosure generally relate to electronic circuits and, more particularly, to coefficient generation for digital filters.

Description of the Related Art

Input devices including proximity sensor devices (also commonly called touchpads or touch sensor devices) are widely used in a variety of electronic systems. A proximity sensor device can include a sensing region, often demarked by a surface, in which the proximity sensor device determines the presence, location and/or motion of one or more input objects. Proximity sensor devices may be used to provide interfaces for the electronic system. For example, proximity sensor devices are often used as input devices for larger computing systems (such as opaque touchpads integrated in, or peripheral to, notebook or desktop computers). Proximity sensor devices are also often used in smaller computing systems (such as touch screens integrated in cellular phones). A proximity sensor can include a large number of parallel channels for processing signals resulting from touch sensing operations. Thus, the complexity and cost for each channel is critical.

SUMMARY

In an embodiment, a circuit includes: a filter configured to process a digital signal through at least one stage; and a coefficient generator circuit configured to generate coefficients for the at least one stage of the filter. The coefficient generator circuit includes: a lookup-table (LUT) configured to output a differential sequence; an up-sampling holder circuit configured to up-sample and hold the differential sequence to generate an up-sampled differential sequence; and an accumulator configured to integrate the up-sampled differential sequence to generate the coefficients.

In another embodiment, a processing system includes: a plurality of receivers configured to output a plurality of analog signals; a plurality of analog-to-digital converters (ADCs) configured to receive the plurality of analog signals and output a plurality of digital signals; a plurality of finite impulse response (FIR) filters each consisting of a single multiply-accumulate (MAC) stage configured to receive a respective one of the plurality of digital signals; and a coefficient generator circuit configured to generate coefficients for the MAC stage of each of the FIR filters. The coefficient generator circuit includes: a lookup-table (LUT) configured to output a differential sequence; an up-sampling holder circuit configured to up-sample and hold the differential sequence to generate an up-sampled differential sequence; and an accumulator configured to integrate the up-sampled differential sequence to generate the coefficients.

In another embodiment, a method of generating coefficients for a filter having at least one stage includes: outputting values of a differential sequence; up-sampling and holding the values of the differential sequence to generate an up-sampled differential sequence; and integrating the up-sampled differential sequence to generate the coefficients.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only some embodiments of this disclosure and are therefore not to be considered limiting of its scope, for the disclosure may admit to other equally effective embodiments.

Figure 1:
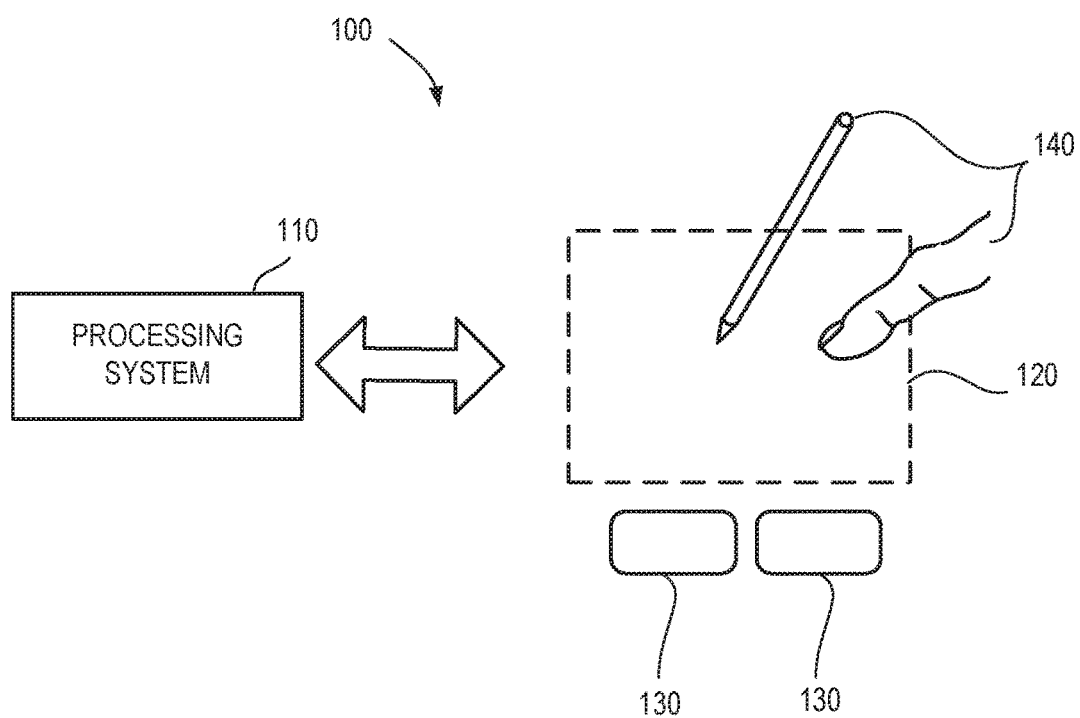
FIG. 1 is a block diagram of an exemplary input device, according to one embodiment described herein.

To facilitate understanding, identical reference numerals have been used, where possible, to designate identical elements that are common to the figures. It is contemplated that elements disclosed in one embodiment may be beneficially utilized on other embodiments without specific recitation. The drawings should not be understood as being drawn to scale unless specifically noted. Also, the drawings may be simplified and details or components omitted for clarity of presentation and explanation. The drawings and discussion serve to explain principles discussed below, where like designations denote like elements.

DETAILED DESCRIPTION

FIG. 1 is a block diagram of an exemplary input device 100, in accordance with embodiments of the disclosure. The input device 100 may be configured to provide input to an electronic system (not shown). As used in this document, the term "electronic system" (or "electronic device") broadly refers to any system capable of electronically processing information. Some non-limiting examples of electronic systems include personal computers of all sizes and shapes, such as desktop computers, laptop computers, netbook computers, tablets, web browsers, e-book readers, and personal digital assistants (PDAs). Additional example electronic systems include composite input devices, such as physical keyboards that include input device 100 and separate joysticks or key switches. Further example electronic systems include peripherals such as data input devices (including remote controls and mice), and data output devices (including display screens and printers). Other examples include remote terminals, kiosks, and video game machines (e.g., video game consoles, portable gaming devices, and the like). Other examples include communication devices (including cellular phones, such as smart phones), and media devices (including recorders, editors, and players such as televisions, set-top boxes, music players, digital photo frames, and digital cameras). Additionally, the electronic system could be a host or a slave to the input device.

The input device 100 can be implemented as a physical part of the electronic system, or can be physically separate from the electronic system. As appropriate, the input device 100 may communicate with parts of the electronic system using any one or more of the following: buses, networks, and other wired or wireless interconnections. Examples include I²C, SPI, PS/2, Universal Serial Bus (USB), Bluetooth, RF, and IRDA.

In FIG. 1, the input device 100 is shown as a proximity sensor device (also often referred to as a "touchpad" or a "touch sensor device") configured to sense input provided by one or more input objects 140 in a sensing region 120. Example input objects include fingers and styli, as shown in FIG. 1.

Sensing region 120 encompasses any space above, around, in and/or near the input device 100 in which the input device 100 is able to detect user input (e.g., user input provided by one or more input objects 140). The sizes, shapes, and locations of particular sensing regions may vary widely from embodiment to embodiment. In some embodiments, the sensing region 120 extends from a surface of the input device 100 in one or more directions into space until signal-to-noise ratios prevent sufficiently accurate object detection. The distance to which this sensing region 120 extends in a particular direction, in various embodiments, may be on the order of less than a millimeter, millimeters, centimeters, or more, and may vary significantly with the type of sensing technology used and the accuracy desired. Thus, some embodiments sense input that comprises no contact with any surfaces of the input device 100, contact with an input surface (e.g. a touch surface) of the input device 100, contact with an input surface of the input device 100 coupled with some amount of applied force or pressure, and/or a combination thereof. In various embodiments, input surfaces may be provided by surfaces of casings within which the sensor electrodes reside, by face sheets applied over the sensor electrodes or any casings, etc. In some embodiments, the sensing region 120 has a rectangular shape when projected onto an input surface of the input device 100.

The input device 100 may utilize any combination of sensor components and sensing technologies to detect user input in the sensing region 120. The input device 100 comprises one or more sensing elements for detecting user input. As several non-limiting examples, the input device 100 may use capacitive, elastive, resistive, inductive, magnetic, acoustic, ultrasonic, and/or optical techniques.

Some implementations are configured to provide images that span one, two, three, or higher dimensional spaces. Some implementations are configured to provide projections of input along particular axes or planes.

In some capacitive implementations of the input device 100, voltage or current is applied to create an electric field. Nearby input objects cause changes in the electric field, and produce detectable changes in capacitive coupling that may be detected as changes in voltage, current, or the like.

Some capacitive implementations utilize arrays or other regular or irregular patterns of capacitive sensing elements to create electric fields. In some capacitive implementations, separate sensing elements may be ohmically shorted together to form larger sensor electrodes. Some capacitive implementations utilize resistive sheets, which may be uniformly resistive.

Some capacitive implementations utilize "self-capacitance" (or "absolute capacitance") sensing methods based on changes in the capacitive coupling between sensor electrodes and an input object. In various embodiments, an input object near the sensor electrodes alters the electric field near the sensor electrodes, thus changing the measured capacitive coupling. In one implementation, an absolute capacitance sensing method operates by modulating sensor electrodes with respect to a reference voltage (e.g. system ground), and by detecting the capacitive coupling between the sensor electrodes and input objects.

Some capacitive implementations utilize "mutual capacitance" (or "transcapacitance") sensing methods based on changes in the capacitive coupling between sensor electrodes. In various embodiments, an input object near the sensor electrodes alters the electric field between the sensor electrodes, thus changing the measured capacitive coupling. In one implementation, a transcapacitive sensing method operates by detecting the capacitive coupling between one or more transmitter sensor electrodes (also "transmitter electrodes" or "transmitters") and one or more receiver sensor electrodes (also "receiver electrodes" or "receivers"). Transmitter sensor electrodes may be modulated relative to a reference voltage (e.g., system ground) to transmit transmitter signals. Receiver sensor electrodes may be held substantially constant relative to the reference voltage to facilitate receipt of resulting signals. A resulting signal may comprise effect(s) corresponding to one or more transmitter signals, and/or to one or more sources of environmental interference (e.g. other electromagnetic signals). Sensor electrodes may be dedicated transmitters or receivers, or may be configured to both transmit and receive.

In FIG. 1, a processing system 110 is shown as part of the input device 100. The processing system 110 is configured to operate the hardware of the input device 100 to detect input in the sensing region 120. The processing system 110 comprises parts of or all of one or more integrated circuits (ICs) and/or other circuitry components. For example, a processing system for a mutual capacitance sensor device may comprise transmitter circuitry configured to transmit signals with transmitter sensor electrodes, and/or receiver circuitry configured to receive signals with receiver sensor electrodes). In some embodiments, the processing system 110 also comprises electronically-readable instructions, such as firmware code, software code, and/or the like. In some embodiments, components composing the processing system 110 are located together, such as near sensing element(s) of the input device 100. In other embodiments, components of processing system 110 are physically separate with one or more components close to sensing element(s) of input device 100, and one or more components elsewhere. For example, the input device 100 may be a peripheral coupled to a desktop computer, and the processing system 110 may comprise software configured to run on a central processing unit of the desktop computer and one or more ICs (perhaps with associated firmware) separate from the central processing unit. As another example, the input device 100 may be physically integrated in a phone, and the processing system 110 may comprise circuits and firmware that are part of a main processor of the phone. In some embodiments, the processing system 110 is dedicated to implementing the input device 100. In other embodiments, the processing system 110 also performs other functions, such as operating display screens, driving haptic actuators, etc.

The processing system 110 may be implemented as a set of modules that handle different functions of the processing system 110. Each module may comprise circuitry that is a part of the processing system 110, firmware, software, or a combination thereof. In various embodiments, different combinations of modules may be used. Example modules include hardware operation modules for operating hardware such as sensor electrodes and display screens, data processing modules for processing data such as sensor signals and positional information, and reporting modules for reporting information. Further example modules include sensor operation modules configured to operate sensing element(s) to detect input, identification modules configured to identify gestures such as mode changing gestures, and mode changing modules for changing operation modes.

In some embodiments, the processing system 110 responds to user input (or lack of user input) in the sensing region 120 directly by causing one or more actions. Example actions include changing operation modes, as well as GUI actions such as cursor movement, selection, menu navigation, and other functions. In some embodiments, the processing system 110 provides information about the input (or lack of input) to some part of the electronic system (e.g. to a central processing system of the electronic system that is separate from the processing system 110, if such a separate central processing system exists). In some embodiments, some part of the electronic system processes information received from the processing system 110 to act on user input, such as to facilitate a full range of actions, including mode changing actions and GUI actions.

For example, in some embodiments, the processing system 110 operates the sensing element(s) of the input device 100 to produce electrical signals indicative of input (or lack of input) in the sensing region 120. The processing system 110 may perform any appropriate amount of processing on the electrical signals in producing the information provided to the electronic system. For example, the processing system 110 may digitize analog electrical signals obtained from the sensor electrodes. As another example, the processing system 110 may perform filtering or other signal conditioning. As yet another example, the processing system 110 may subtract or otherwise account for a baseline, such that the information reflects a difference between the electrical signals and the baseline. As yet further examples, the processing system 110 may determine positional information, recognize inputs as commands, recognize handwriting, and the like.

"Positional information" as used herein broadly encompasses absolute position, relative position, velocity, acceleration, and other types of spatial information. Exemplary "zero-dimensional" positional information includes near/far or contact/no contact information. Exemplary "one-dimensional" positional information includes positions along an axis. Exemplary "two-dimensional" positional information includes motions in a plane. Exemplary "three-dimensional" positional information includes instantaneous or average velocities in space. Further examples include other representations of spatial information. Historical data regarding one or more types of positional information may also be determined and/or stored, including, for example, historical data that tracks position, motion, or instantaneous velocity over time.

In some embodiments, the input device 100 is implemented with additional input components that are operated by the processing system 110 or by some other processing system. These additional input components may provide redundant functionality for input in the sensing region 120, or some other functionality. FIG. 1 shows buttons 130 near the sensing region 120 that can be used to facilitate selection of items using the input device 100. Other types of additional input components include sliders, balls, wheels, switches, and the like. Conversely, in some embodiments, the input device 100 may be implemented with no other input components.

In some embodiments, the input device 100 comprises a touch screen interface, and the sensing region 120 overlaps at least part of an active area of a display screen. For example, the input device 100 may comprise substantially transparent sensor electrodes overlaying the display screen and provide a touch screen interface for the associated electronic system. The display screen may be any type of dynamic display capable of displaying a visual interface to a user, and may include any type of light emitting diode (LED), organic LED (OLED), cathode ray tube (CRT), liquid crystal display (LCD), plasma, electroluminescence (EL), or other display technology. The input device 100 and the display screen may share physical elements. For example, some embodiments may utilize some of the same electrical components for displaying and sensing. As another example, the display screen may be operated in part or in total by the processing system 110.

It should be understood that while many embodiments of the disclosure are described in the context of a fully functioning apparatus, the mechanisms of the present disclosure are capable of being distributed as a program product (e.g., software) in a variety of forms. For example, the mechanisms of the present disclosure may be implemented and distributed as a software program on information bearing media that are readable by electronic processors (e.g., non-transitory computer-readable and/or recordable/writable information bearing media readable by the processing system 110). Additionally, the embodiments of the present disclosure apply equally regardless of the particular type of medium used to carry out the distribution. Examples of non-transitory, electronically readable media include various discs, memory sticks, memory cards, memory modules, and the like. Electronically readable media may be based on flash, optical, magnetic, holographic, or any other storage technology.

Figure 2:
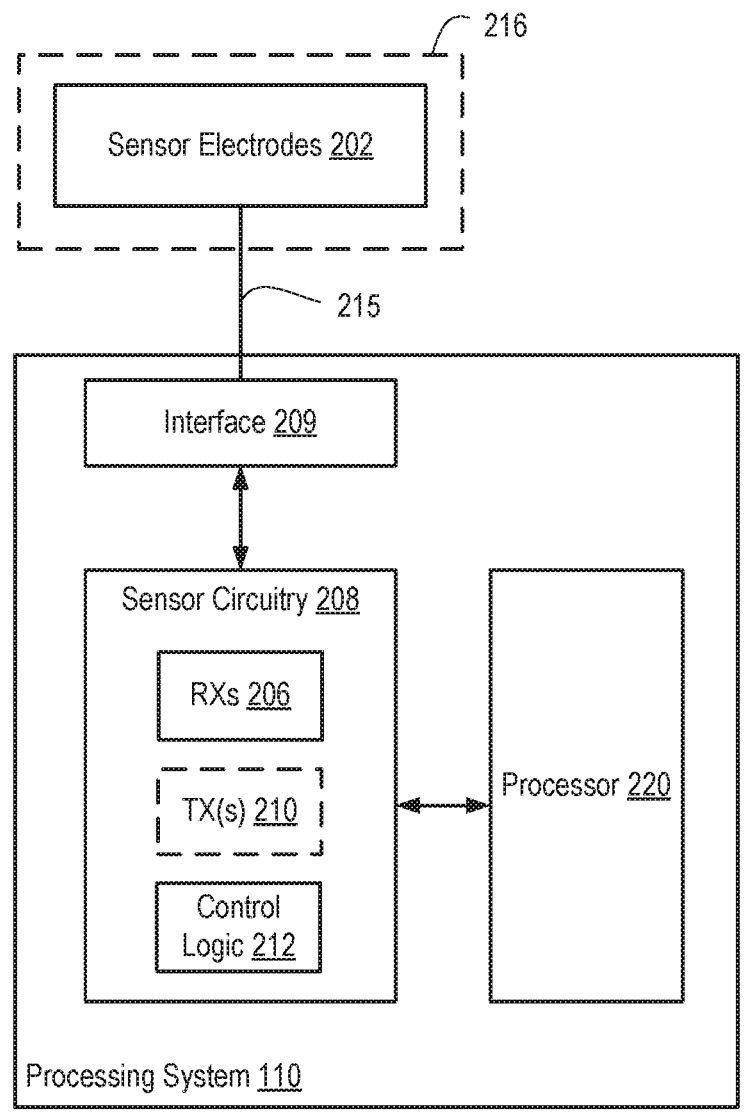
FIG. 2 is a block diagram depicting a portion of the input device of FIG. 1 according to an embodiment.

FIG. 2 is a block diagram depicting a portion of the input device 100 according to an embodiment. The processing system 110 is coupled to a plurality of sensor electrodes 202. The sensor electrodes 202 are disposed in the sensing region 120 of the input device 100 (FIG. 1) and can be arranged in various patterns, such as a bars and stripes pattern, a matrix pattern, or the like. The sensor electrodes 202 can be formed on one or more substrates 216. In some touch screen embodiments, all or a portion of the sensor electrodes 202 are display electrodes of a display panel used in updating a display, such as one or more segments of a "Vcom" electrode (common electrodes), gate electrodes, source electrodes, anode electrodes and/or cathode electrodes. These display electrodes may be disposed on an appropriate display screen substrate. For example, the display electrodes may be disposed on a transparent substrate (a glass substrate, TFT glass, or any other transparent material) in some display screens (e.g., In Plane Switching (IPS) or Plane to Line Switching (PLS) Organic Light Emitting Diode (OLED)), on the bottom of the color filter glass of some display screens (e.g., Patterned Vertical Alignment (PVA) or Multi-Domain Vertical Alignment (MVA)), over an emissive layer (OLED), etc. The display electrodes can also be referred to as "common electrodes," since the display electrodes perform functions of display updating and capacitive sensing.

The processing system 110 includes sensor circuitry 208 that operates the sensor electrodes 202 to receive resulting signals. The sensor circuitry 208 is coupled to the sensor electrodes 202 through an interface 209. The interface 209 can include various switches, multiplexers, and the like that couple the sensor circuitry 208 to the sensor electrodes 202 through electrical connections 215. The sensor circuitry 208 includes a plurality of receivers (RXs) 206 and control logic 212. In some embodiments, the sensor circuitry 208 also includes one or more transmitters (TXs) 210. The control logic 212 is configured to control the receivers 206 and the transmitters 210 (if present).

In an embodiment, the sensor circuitry 208 operates the sensor electrodes for absolute capacitive sensing. In such case, the receivers 206 are coupled to the sensor electrodes 202 through the interface 209. Each sensor electrode 202 has a self-capacitance to system ground and forms a touch node for detecting object(s) in the sensing region 120. As an object approaches the sensor electrodes 202, additional capacitances to ground can be formed between the sensor electrodes 202 and the object. The additional capacitances result in a net increase in self-capacitances of at least a portion of the sensor electrodes 202. The receivers 206 measure self-capacitances of the sensor electrodes 202 and generate resulting signals in response thereto.

In an embodiment, the sensor circuitry 208 operates the sensor electrodes for transcapacitive sensing. In such case, the transmitter(s) 210 are coupled to one or more transmitter electrodes of the sensor electrodes 202 through the interface 209. The receivers 206 are coupled to receiver electrodes of the sensor electrodes 202. The receiver electrodes form mutual capacitances with the transmitter electrode(s) through crossings or adjacencies. The transmitter(s) 210 drive an alternating current (AC) waveform on the transmitter electrode(s), which is coupled to the receiver electrodes through the mutual capacitances. An object approaching the sensor electrodes 202 results in a net decrease in the mutual capacitances and a reduction in the AC waveform coupled to at least a portion of the receiver electrodes. The receivers 206 measure the AC waveforms on the receiver electrodes and generate resulting signals in response thereto.

A processor 220 receives resulting signals from the sensor circuitry 208. The processor 220 is configured to determine capacitive measurements from the resulting signals received by the sensor circuitry 208. The processor 220 can also determine position information for input object(s) from the capacitive measurements.

In an embodiment, the processing system 110 comprises a single integrated controller, such as an application specific integrated circuit (ASIC), having the sensor circuitry 208, the processor 220, and any other circuit(s). In another embodiment, the processing system 110 can include a plurality of integrated circuits, where the sensor circuitry 208, the processor 220, and any other circuit(s) can be divided among the integrated circuits. For example, the sensor circuitry 208 can be on one integrated circuit, and the processor 220 and any other circuit(s) can be one or more other integrated circuits. In some embodiments, a first portion of the sensor circuitry 208 can be on one integrated circuit and a second portion of the sensor circuitry 208 can be on second integrated circuit.

Decimation Filtering for Parallel ADC Channels

Figure 3:
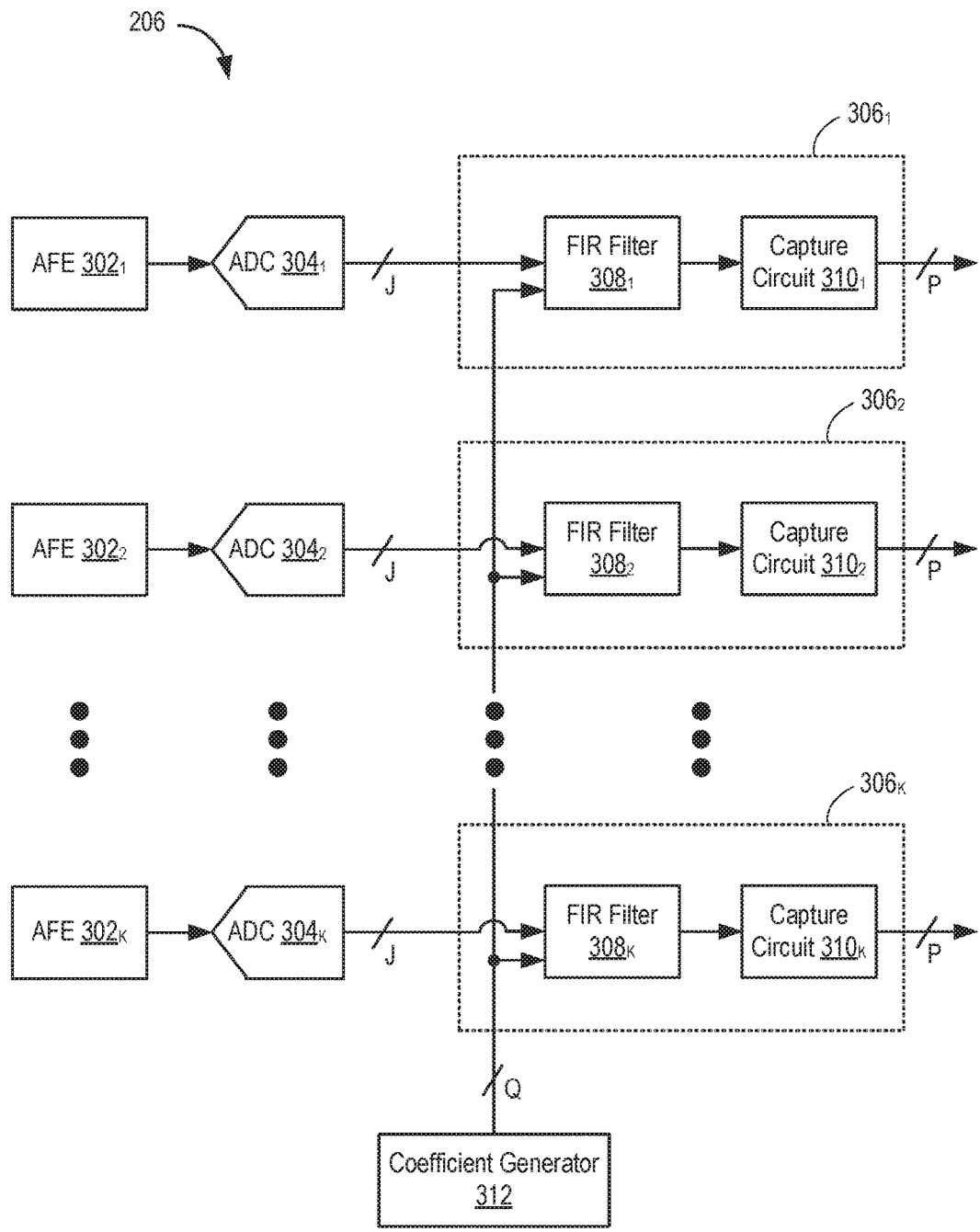
FIG. 3 is a block diagram depicting receivers of a processing system according to an embodiment.

FIG. 3 is a block diagram depicting the receivers 206 according to an embodiment. The receivers 206 include K channels, where K is an integer greater than zero. In some touch screen embodiments, K can be large. For example, K can be on the order of 400 for large display and touch sensing system. The receivers 206 include analog front ends (AFEs) $302_1 \ldots 302_K$ (generally AFEs 302 or AFE 302), analog-to-digital converters (ADCs) $304_1 \ldots 304_K$ (generally ADCs 304 or ADC 304), and decimation filter circuits ("decimation filters $306_1 \ldots 306_K$," generally decimation filters 306 or decimation filter 306). The decimation filters $306_1 \ldots 306_K$ include finite impulse response (FIR) filter circuits ("FIR filters $308_1 \ldots 308_K$," generally FIR filters 308 for FIR filter 308) and capture circuits $310_1 \ldots 310_K$ (generally capture circuits 310 or capture circuit 310). The receivers 206 further include a coefficient generator circuit ("coefficient generator 312") that is shared among all K channels.

For each channel, an output of the AFE 302 is coupled to an input of the ADC 304. An output of the ADC 304 is coupled to an input of the FIR filter 308. An output of the FIR filter 308 is coupled to an input of the capture circuit 310. An output of the coefficient generator 312 is coupled to the input of each FIR filter $308_1 \ldots 308_K$.

For each channel, the AFE 302 is coupled to at least one sensor electrode 202 and generates an analog signal as output. The AFE 302 can include a charge integrator, current conveyer, or the like configured to measure charge or current on sensor electrode(s) 202. The AFE 302 converts the measured charge or current into an analog voltage.

For each channel, the ADC 304 generates a digital signal from the analog signal output by the AFE 302. As used herein an analog signal is a continuous time signal. A digital signal is a discrete time, discrete amplitude signal. A digital signal having $2^X$ potential discrete amplitudes has a width of X bits (X>0). A digital signal can include a series of X-bit values (words, samples, etc.) The ADC 304 generates a digital signal having a width of J bits, where J is an integer greater than zero. In a specific embodiment, the ADC 304 generates a 1-bit digital signal (i.e., J=1). The ADC 304 can be a sigma-delta ADC or like type circuit. In an embodiment, the ADC 304 has an oversampling ratio (OSR) of N, where N is an integer greater than one. For example, a 1-bit ADC can have an OSR of N=3600. The OSR of the ADC 304 can be set by the control logic 212.

For each channel, the FIR filter 308 is a discrete-time FIR filter having length of N (order of N−1). The output sequence of the FIR filter 308 can be expressed as:

$$y[n] = \sum_{i=0}^{N-1} h[n] \cdot x[n-i],$$

where x[n] the sequence output by the ADC 304, y[n] is the output sequence of the FIR filter 308, and h[n] is the coefficient sequence. In an embodiment, the FIR filter 308 is implemented using a multiplier and a single accumulator. The multiplier has one J-bit operand and one Q-bit operand. The multiplier successively multiples a value x[n] in the input sequence (i.e., a J-bit value output by the ADC 304) by a Q-bit coefficient h[n] provided by the coefficient generator 312. The accumulator accumulates the N products over N multiplication operations to generate an output value y[n]. The FIR filters $308_1 \ldots 308_K$ share the coefficients output by the coefficient generator 312. An embodiment of the FIR filter 308 is described below with respect to FIG. 4.

For each channel, the capture circuit 310 captures the output values y[n] of the FIR filter 308. The FIR filter 308 outputs a P-bit wide digital signal, where P is an integer greater than or equal the width Q of the coefficient signal output by the coefficient generator 312. The capture circuit 310 outputs an R-bit wide digital signal, where R is an integer greater than zero. In an embodiment, R is equal to P. Alternatively, R can be less than P. That is, the capture circuit 310 can reduce the P-bit output of the FIR filter 308 to an R-bit output having coarser resolution than the P-bit output (e.g., by removing a number of least significant bits (LSBs) or performing some other technique to reduce the width of the FIR filter output). The R-bit values output by the capture circuit 310 have 1/Nth the sample-rate as the J-bit values output by the ADC 304. Thus, the decimation filter 306 has an N:1 down-sampling ratio.

The coefficient generator 312 outputs a digital signal (referred to as a "coefficient signal") having a width of Q, where Q is an integer greater than zero. The coefficient generator 312 generates a repeating sequence of N coefficients (e.g., the sequence h[n]) that represent the impulse response of each FIR filter 308. In an embodiment, the coefficient set is based on a window function, although other functions can be used. In general, the coefficients output by the coefficient generator 312 are positive or negative or zero values quantized into, and represented by, words having a width of Q bits. In one embodiment, the coefficients output by the coefficient generator 312 are positive or zero values, which avoids the need to perform signed arithmetic. Embodiments of the coefficient generator 312 are described further below.

Figure 4:
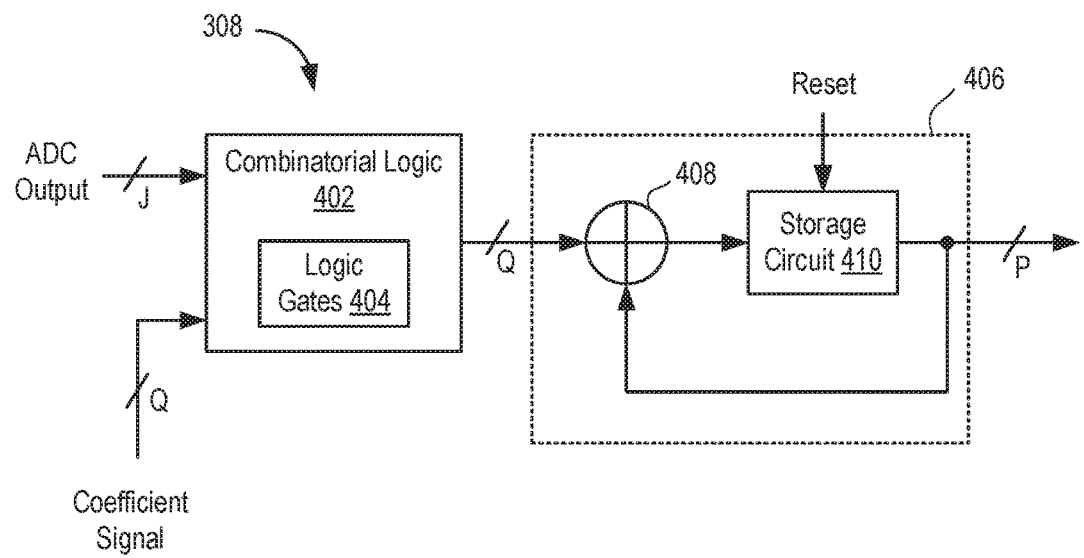
FIG. 4 is a block diagram depicting a finite impulse response (FIR) filter according to an embodiment.

FIG. 4 is a block diagram depicting an FIR filter 308 according to an embodiment. The FIR filter 308 includes a combinatorial logic circuit ("combinatorial logic 402") and an accumulator circuit ("accumulator 406"). The combinatorial logic 402 includes a plurality of logic gates 404. The accumulator 406 includes an adder circuit ("adder") 408 and a storage circuit 410. A first input of the combinatorial logic 402 receives the digital signal output by an ADC 304. A second input of the combinatorial logic 402 receives the coefficient signal output by the coefficient generator 312. An output of the combinatorial logic 402 is coupled to a first input of the adder 408. An output of the adder 408 is coupled to an input of the storage circuit 410. An output of the storage circuit 410 is coupled to a second input of the adder 408.

Mathematically, the FIR filter 308 is a multiply accumulator (MAC). The complexity of the multiplication in each channel can be reduced by taking advantage of the fact that the output of each ADC 304 has a small width (e.g., J=1). For example, if J=1, the 1-bit by Q-bit multiplication operation can be implemented by gating the coefficient by the ADC data bit (i.e., output=0 if ADC data is 0; output=coefficient if ADC data is 1). Alternatively, a 1-bit ADC output can be mapped to +1 and −1, rather than 0 and 1. The 1-bit by Q-bit multiplication operation can be implemented by outputting +coefficient if the ADC data is +1 and −coefficient if the ADC data is −1. In such case, there is no systemic DC offset in the FIR filter output that is due to the manner of interpreting ADC output codes. In other examples, J can be more than 1 bit. For example, given a 3-level ADC output (e.g., J=2), then the ADC output can be mapped to −1, 0, +1 or 0, 1, 2. In such case, the multiplication operation can be implemented by outputting −coefficient, zero, +coefficient, or zero, coefficient, and 2*coefficient, respectively.

Figure 5:
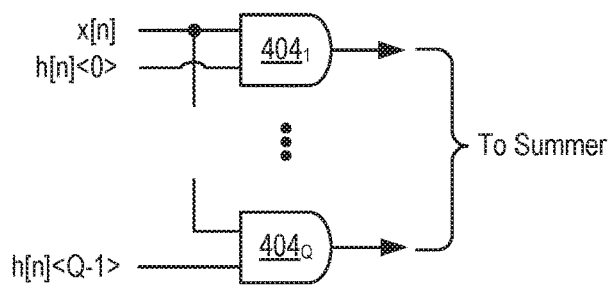
FIG. 5 is a block diagram depicting combinatorial logic configured to perform multiplication operations according to an embodiment.

FIG. 5 is a block diagram depicting the combinatorial logic 402 according to an embodiment the digital signals output by the ADCs 304 have a width of 1-bit (e.g., J=1). The combinatorial logic 402 includes logic gates $404_1 \ldots 404_Q$. Each of the logic gates $404_1 \ldots 404_Q$ is an AND gate. Each logic gate $404_1 \ldots 404_Q$ includes a first input receiving the digital signal output by an ADC 302 (represented by a value x[n]). Second input of the logic gates $404_1 \ldots 404_Q$ receive bits 0 through Q−1 of the Q-bit coefficient signal (represented by values h[n]<0> through h[n]<Q−1>). Outputs of the logic gates $404_1 \ldots 404_Q$ are collectively provided as a Q-bit input to the summer 408.

Returning to FIG. 4, the multiplication operation performed by the combinatorial logic 402 can be unsigned, which simplifies the implementation. In this manner, the multiply and accumulate operation is less complex than a scheme where the ADC data is mapped into signed sample values and then processed using signed multiplication using a multiplier. In embodiments, the ADC output can be more than one bit wide. In such embodiments, the complexity of the combinatorial logic 402 scales with the increase in width of the ADC output. However, the FIR filter 308 still exhibits reduced complexity when the ADC output has a small width (e.g., three or less bits), as compared to an FIR filter employing a signed multi-bit by multi-bit multiplier followed by a plurality of accumulator and differentiation stages.

The accumulator 406 accumulates the products output by the combinatorial logic 402. The length of the FIR filter 308 is dictated by the length of the coefficient sequence (i.e., N). The storage circuit 410 has a width of P. The width P can be set to avoid overflow of the addition operations performed by the adder 408. The storage circuit 410 can be implemented using P D-type flip-flops, for example. The storage circuit 410 can include an input that receives a reset signal for resetting the value stored by the storage circuit 410 to zero. The reset signal can be provided by a control signal or by the capture circuit 310 after capturing an output value y[n], or by a combination thereof.

Figure 6:
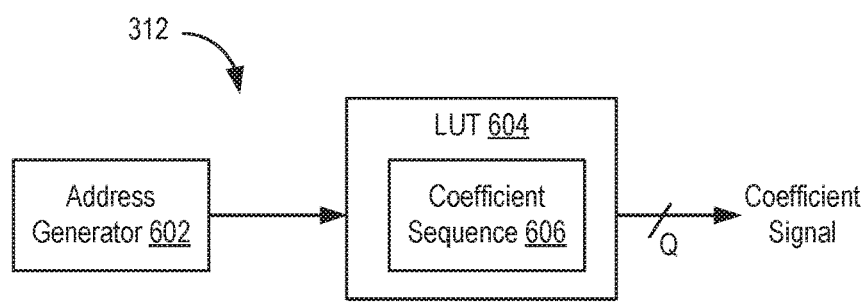
FIG. 6 is a block diagram depicting a coefficient generator according to an embodiment.

FIG. 6 is a block diagram depicting the coefficient generator 312 according to an embodiment. The coefficient generator 312 includes a lookup table (LUT) 604 and an address generator circuit ("address generator 602"). The LUT 604 can be implemented using any type of memory circuit (e.g., random access memory (RAM), read-only memory (ROM), etc.) and is configured to store a coefficient sequence 606. The LUT 604 has a width of Q and a depth of N. The address generator 602 generates addresses for the LUT 604 such that the LUT 604 outputs a repeating sequence of N coefficients.

Figure 7:
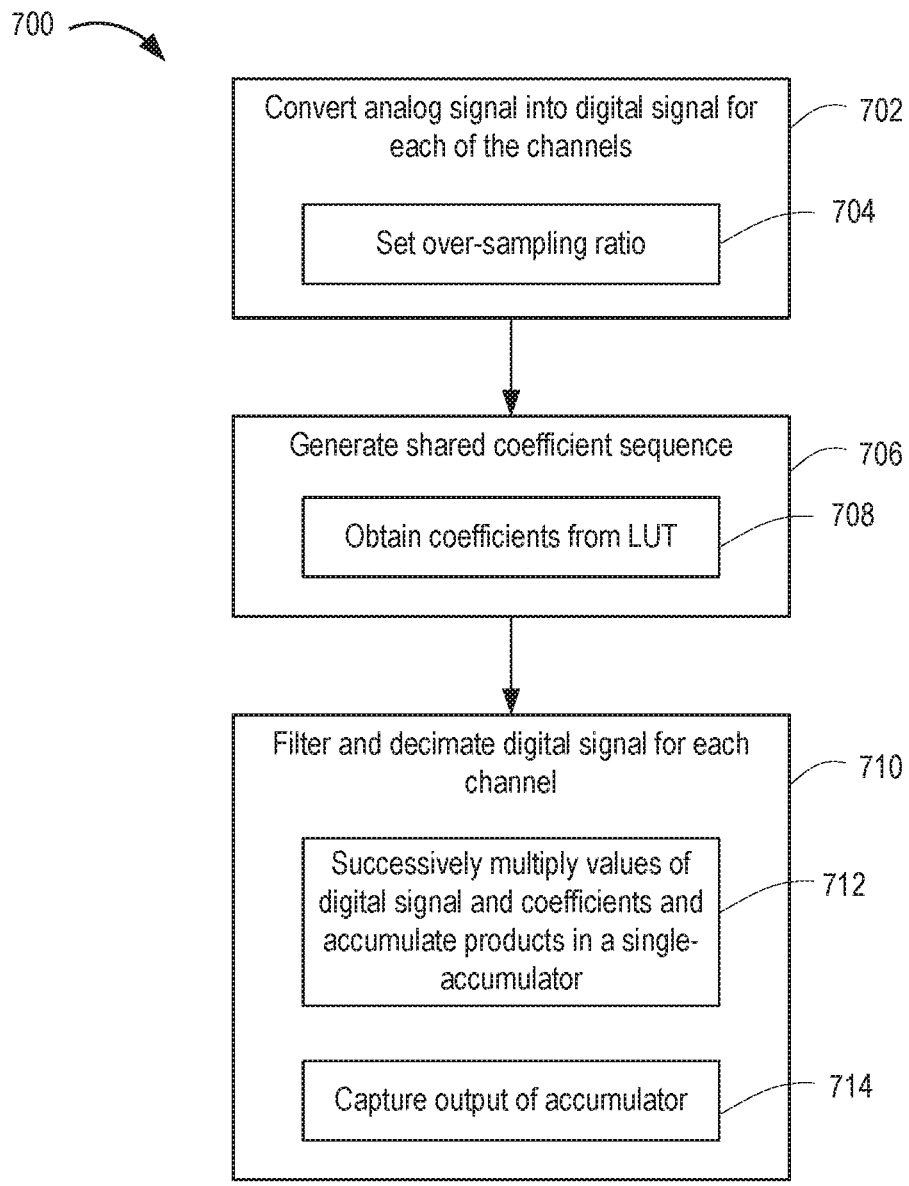
FIG. 7 is a flow diagram depicting a method of processing a plurality of analog signals according to an embodiment.

FIG. 7 is a flow diagram depicting a method 700 of processing a plurality of analog signals according to an embodiment. The method 700 summarizes the operation of the channels as described above. The method 700 begins a step 702, where an ADC 302 converts an analog signal into a digital signal for each of the channels. At step 704, the control logic 212 sets the OSR of each ADC 302. At step 706, the coefficient generator 312 generates a shared coefficient sequence. In an embodiment, at step 708, the coefficient generator 312 obtains the coefficients from the LUT 604. An alternative embodiment for generating coefficients that can be used in step 706 is described further below.

At step 710, a decimation filter 306 in each channel filters and decimates the digital signal. In an embodiment, at step 712, an FIR filter 308 successively multiplies N values of the digital signal by N coefficients of the coefficient sequence to generate N products. The FIR filter 308 accumulates the N products in a single accumulator. At step 714, a capture circuit 310 captures the output of the FIR filter 308, which has 1/Nth the sample rate as the input to the FIR filter 308.

The decimation filtering techniques have been described with respect to channels of a capacitive sensing device, such as that shown in FIGS. 1-2. It is to be understood, however, that the structure shown in FIG. 3 can be implemented in other types of applications having parallel ADC channels. Decimation filters can be designed as multi-stage, multi-rate processing paths (e.g., cascaded-integrator comb (CIC) decimation filtering stages operating at higher sample rates followed by FIR decimation filtering stages operating at lower sample rates). However, for a multiple channel system, the complexity of such multi-stage, multi-rate decimation filters scales with the number of channels. The decimation filtering techniques described in embodiments herein exhibit low complexity per channel, and thus are particularly suited for applications having a large number of parallel ADC channels.

In an embodiment, the decimation filters 306 can be implemented together with the ADCs 304 in the analog domain. This obviates the need to route a large number of high-speed ADC output signals from analog integrated circuit block to digital integrated circuit block over long distances.

In various examples above, the width of the ADC output is one bit (e.g., J=1). The decimation filtering techniques described herein also can be employed if the ADC output is more than one bit. However, the complexity of the FIR filters 308 scales with the width of the ADC output. Thus, FIR filters 308 with low complexity can be achieved when the ADC output is one bit wide or a small number of bits wide (e.g., 2 or 3 bits).

The coefficient sequence generated by the coefficient generator 312 can be relatively long, depending on the OSR of the ADCs 302. Thus, the coefficient generator 312 can include a relatively large LUT to store the entire coefficient sequence. For systems with a large number of parallel ADC channels, the extra complexity of the large LUT to store the coefficient sequence is shared by a large number of channels. The complexity of the coefficient generator 312 can be further reduced using the techniques described below for generating long coefficient sequences.

Coefficient Sequence Generation

Figure 8:
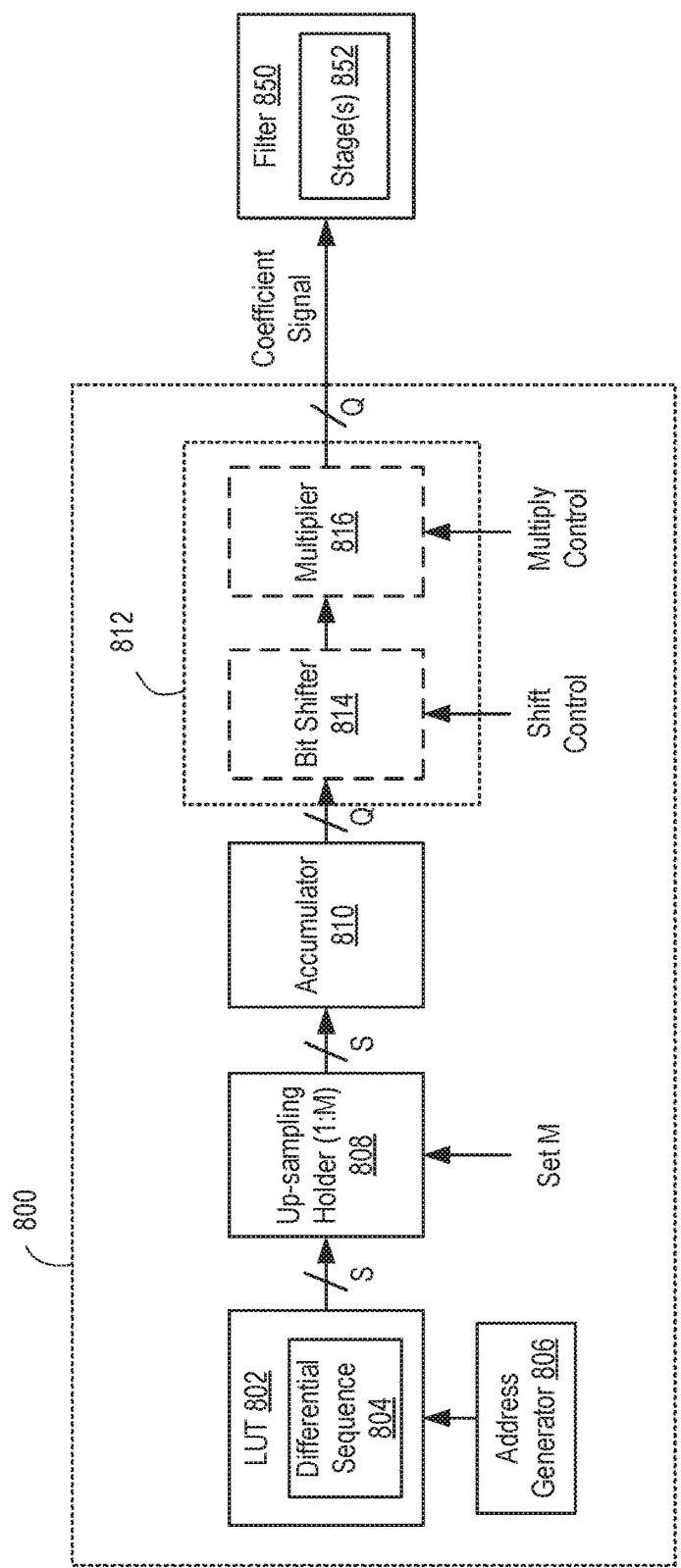
FIG. 8 is a block diagram depicting a coefficient generator according to another embodiment.

FIG. 8 is a block diagram depicting a coefficient generator 800 according to an embodiment. In an embodiment, the coefficient generator 800 can be used as the coefficient generator 312 in the receivers 206 described above in FIG. 3. However, the coefficient generator 800 can be used in other applications. In general, the coefficient generator 800 can be used to generate coefficients for a filter 850 having one or more stages 852 and having a length of N.

In an embodiment, the coefficient generator 800 includes a LUT 802, an address generator circuit ("address generator 806"), an up-sampling holder circuit ("up-sampling holder 808"), and an accumulator 810. In some embodiments, the coefficient generator 800 further includes a normalizer circuit ("normalizer 812"). In embodiments, the normalizer 812 includes a bit-shifter circuit ("bit-shifter 814"). In other embodiments, the normalizer 812 includes both the bit-shifter 814 and a multiplier circuit ("multiplier 816").

An input of the LUT 802 is coupled to an output of the address generator 806. An output of the LUT 802 is coupled to an input of the up-sampling holder 808. An output of the up-sampling holder 808 is coupled to an input of the accumulator 810. An output of the accumulator 810 can supply a coefficient signal. In embodiments having the normalizer 812, the output of the accumulator 810 is coupled to an input of the bit-shifter 814. An output of the bit-shifter 814 can supply the coefficient signal. In embodiments having the multiplier 816, the output of the bit-shifter 814 is coupled to an input of the multiplier 816. An output of the multiplier 816 can supply the coefficient signal. The coefficient signal is a digital signal having a width of Q bits, where Q is an integer greater than zero.

In an embodiment, the LUT 802 stores a differential sequence 804. The differential sequence 804 can include L values, where L is an integer greater than one. The L values of the differential sequence 804 represent a first derivative of an impulse response for the filter 850. The output of the LUT 802 is a digital signal having a width S, where S is an integer greater than one. In an embodiment, the width S of the LUT 802 is less than the width Q of the output of the coefficient generator 800. The address generator 806 generates addresses for the LUT 802 to successively output sequences of the L values.

In an embodiment, the window function is designed as a symmetric even function. In such case, the differential sequence is a symmetric odd function. In an embodiment, the LUT 802 can store only L/2 values for the first half of the differential sequence. The LUT 802 can include circuitry for outputting negative versions of stored values for the second half of the differential sequence. If the differential sequence of length L to be stored is instead an even function, the LUT 802 can still store only L/2 values for the first half of the differential sequence. The address generator 806 can then generate addresses in a backwards manner to output the second half of the differential sequence from the LUT 802.

Figure 9A:
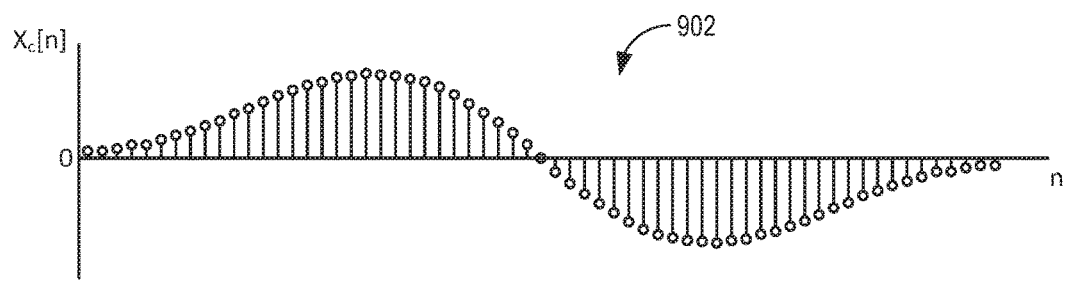
FIGS. 9A-9C are graphs depicting various sequences generated by the coefficient generator of FIG. 8.

FIG. 9A is a graph depicting a differential sequence 902 that can be stored in the LUT 802. The x-axis of the graph represents the sample number (n), and the y-axis of the graph represents the differential sequence value (referred to as $X_C[n]$).

Returning to FIG. 8, the up-sampling holder 808 up-samples the digital signal output by the LUT 802 by a factor of M, where M is an integer greater than zero. The up-sampling holder 808 outputs M instances of each value in the sequence output by the LUT 802. The up-sampling holder 808 outputs a digital signal having the width S and including a sequence of length N=M*L, where N is the length of the impulse response for the filter 850. The up-sampling holder 808 can include an input configured to receive a control signal ("Set M") to set the value of M (i.e., set the up-sampling ratio).

Figure 9B:
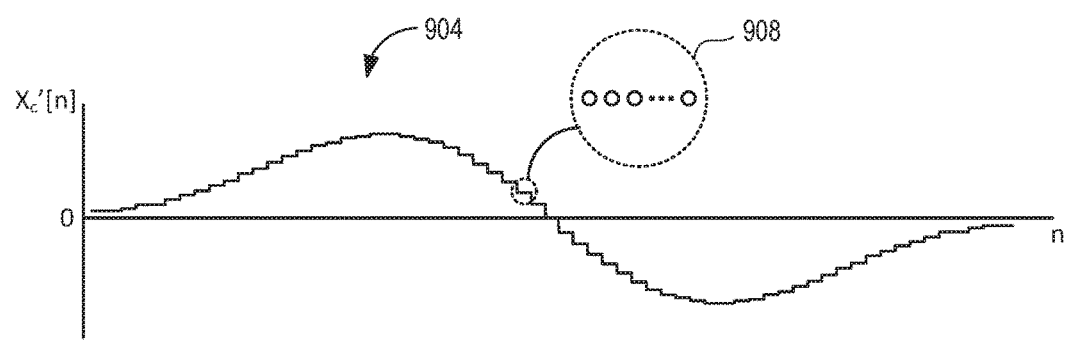

FIG. 9B is a graph illustrating an up-sampled differential sequence 904 as output by the up-sampling holder 808. The x-axis of the graph represents the sample number (n), and the y-axis of the graph represents the up-sampled differential sequence value (referred to as $X_C'[n]$). As shown in detail 908, each "step" of the up-sampled differential sequence 904 includes M values.

Returning to FIG. 8, the accumulator 810 integrates the up-sampled differential sequence output by the up-sampling holder 808. For example, the accumulator 810 can be a filter with the transfer function $1/(1-z^{-1})$. The accumulator 810 outputs a digital signal having a width Q. The output of the accumulator 810 is a repeating sequence of N values representing an impulse response for the filter 850.

Figure 9C:
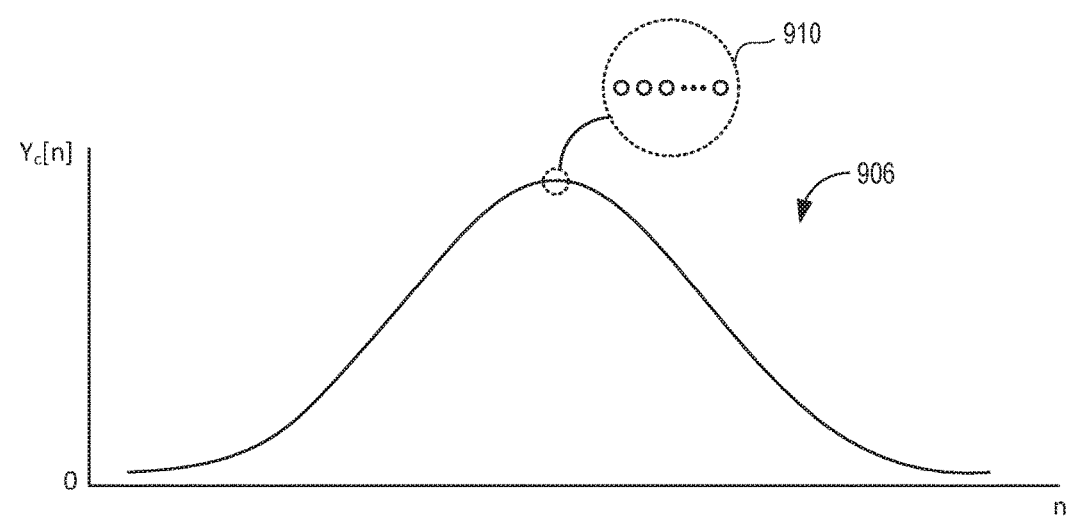

FIG. 9C is a graph illustrating an integrated sequence 906 as output by the accumulator 810. The x-axis of the graph represents the sample number (n), and the y-axis of the graph represents the integrated sequence value (referred to as $Y_C[n]$). The integrated sequence 906 can include a large number of samples as compared to the differential sequence 902 shown in FIG. 9A. As shown by detail 910, the integrated sequence 910 is a sequence of discrete values (N total values). One example configuration of the coefficient generator 800 is L=32, M=100, and N=32*100=3200. Any other of a myriad of configurations are possible.

Returning to FIG. 8, in an embodiment, the coefficient generator 800 includes the normalizer 812. The normalizer 812 can be used to maintain the magnitude of the impulse response as the up-sampling ratio is changed from a nominal value (i.e., as M is changed at the up-sampling holder 808). In embodiments, the targeted filter lengths are elements of a geometric sequence with a common ratio of two (e.g., 800, 1600, 3200, 6400, etc.). In such embodiments, the normalizer 812 can be implemented using the bit shifter 814. The bit-shifter 814 includes an input for receiving a shift control signal, which can be provided by the control logic 212. For example, if M is nominally 100 to generate a coefficient sequence of length N=3200, changing M to 200 generates a coefficient sequence of length N=6400. For example, to maintain the magnitude of the impulse response, the bit shifter 814 can perform a right-shift to divide the integrated sequence output by the accumulator 810 by two. If finer granularity of targeted filter lengths and less than two-times variation (6 dB) of coefficient magnitude are desired, the normalizer 812 can include the multiplier 816. The multiplier 816 can be a Canonic Signed Digits (CSD) multiplier or the like. The multiplier 816 includes an input for receiving a multiply control signal, which can be provided by the control logic 212. The normalizer 812 can normalize the impulse response in other ways to maintain other parameters (e.g., normalize to maintain DC gain of an FIR filter).

In the example of FIG. 8, a differential sequence is stored in the LUT 802. In another example, L samples or L/2 samples of the impulse response can be stored in the LUT 802 and the coefficient generator 800 can include a differentiation circuit coupled between the LUT 802 and the up-sampling holder 808 that outputs the differential sequence. In the example of FIG. 8, there is a single stage of differentiation and integration. In other examples, the coefficient generator 800 can include more than one stage of differentiation and integration. For example, the LUT 802 can store a higher than first order differential sequence and the coefficient generator 800 can include more than one accumulator 810. In another example, the LUT 802 can store the impulse response and the coefficient generator 800 can include multiple differentiator circuits before the up-sampling holder 808 and more than one accumulator 810 after the up-sampling holder 808.

Figure 10:
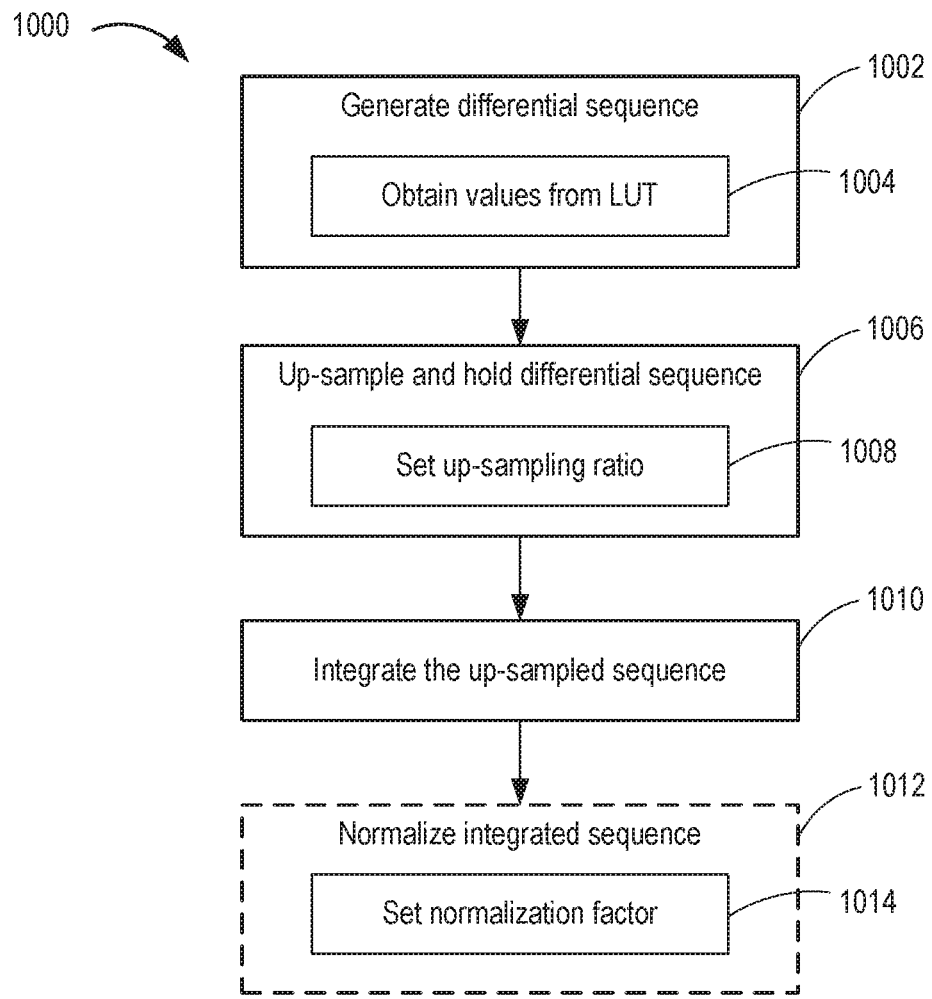
FIG. 10 is a flow diagram depicting a method of generating coefficients for a filter according to an embodiment.

FIG. 10 is a flow diagram depicting a method 1000 of generating coefficients for a filter according to an embodiment. The method 1000 begins at step 1002, where the coefficient generator 800 generates a differential sequence. For example, at step 1004, the LUT 802 can output L values of a differential sequence. At step 1006, the up-sampling holder 808 up-samples and holds the differential sequence to generate an up-sampled differential sequence using a 1:M up-sampling ratio. At step 1008, the control logic 212 sets the up-sampling ratio (e.g., sets the value of M). At step 1010, the accumulator 810 integrates the up-sampled sequence to generate an integrated sequence. The integrated sequence includes N=M*L values corresponding to the desired length of the filter 850. At optional step 1012, the normalizer 812 normalizes the integrated sequence to maintain a desired magnitude of the coefficients. At step 1014, the control logic 112 sets the normalization factor. For example, the control logic 112 can set the shift control value for the bit shifter 814. In another example, the control logic 112 can set both the shift control value for the bit shifter 814 and the multiply control value for the multiplier 816.

The techniques of coefficient generation described above with respect to FIGS. 8-10 encompass interpolating a short LUT to generate a long coefficient sequence that is suitable for efficient realization in real-time hardware. Generating a long coefficient set from a smaller programmable LUT achieves lower system cost while maintaining flexibility of programmable coefficient function and window shape. Low-cost implementation is achieved by: 1) the interpolation operation is implemented using a small number of digital circuit blocks that perform up-sampling/holding, accumulation, and optionally normalization; 2) the LUT size is substantially reduced in terms of depth through interpolation and width by using a differential sequence instead of the coefficient function itself; and 3) various lengths for the coefficient set to be generated without changing the size of the LUT or re-programming the LUT by changing the interpolation ratio.

The coefficient generation techniques can be employed in various systems, such as over-sampled systems having filters that use a long set of coefficients to produce a processed result. In an embodiment, the coefficient generator 800 is used as the coefficient generator 312 in the receivers 206 of the input device 100.

The embodiments and examples set forth herein were presented to explain the embodiments in accordance with the present technology and its particular application and to thereby enable those skilled in the art to make and use the disclosure. However, those skilled in the art will recognize that the foregoing description and examples have been presented for the purposes of illustration and example only. The description as set forth is not intended to be exhaustive or to limit the disclosure to the precise form disclosed.

In view of the foregoing, the scope of the present disclosure is determined by the claims that follow.

We claim:
1. A circuit, comprising:
    a filter configured to process a digital signal through at least one stage; and
    a coefficient generator circuit configured to generate coefficients for the at least one stage of the filter, the coefficient generator circuit including:
    a lookup-table (LUT) configured to output a differential sequence;
    an up-sampling holder circuit configured to up-sample and hold the differential sequence to generate an up-sampled differential sequence; and
    an accumulator configured to integrate the up-sampled differential sequence to generate the coefficients.

2. The circuit of claim 1, wherein the differential sequence includes L values, where L is an integer greater than one, and wherein the differential sequence output by the LUT includes successive sequences of the L values.

3. The circuit of claim 2, wherein the up-sampling holder circuit includes a 1:M up-sampling ratio, where M is an integer greater than L.

4. The circuit of claim 3, wherein the coefficients include successive sequences of N=L*M values.

5. The circuit of claim 1, wherein the coefficient generator circuit further includes a normalizer circuit configured to normalize the coefficients output by the accumulator.

6. The circuit of claim 5, wherein the normalizer circuit includes a bit-shifter circuit coupled to output of the accumulator.

7. The circuit of claim 6, wherein the normalizer circuit includes a multiplier circuit coupled to output of the bit-shifter circuit.

8. The circuit of claim 1, wherein the filter is a finite impulse response (FIR) filter and the at least one stage includes a multiplier and a single accumulation stage.

9. The circuit of claim 8, wherein the coefficient generator is configured to provide the coefficients to a plurality of additional filters, each being an FIR filter having a multiplier and a single accumulation stage.

10. A processing system, comprising:
a plurality of receivers configured to output a plurality of analog signals;
a plurality of analog-to-digital converters (ADCs) configured to receive the plurality of analog signals and output a plurality of digital signals;
a plurality of finite impulse response (FIR) filters each consisting of a single multiply-accumulate (MAC) stage configured to receive a respective one of the plurality of digital signals; and
a coefficient generator circuit configured to generate coefficients for the MAC stage of each of the FIR filters, the coefficient generator circuit including:
a lookup-table (LUT) configured to output a differential sequence;
an up-sampling holder circuit configured to up-sample and hold the differential sequence to generate an up-sampled differential sequence; and
an accumulator configured to integrate the up-sampled differential sequence to generate the coefficients.

11. The processing system of claim 10, wherein the differential sequence includes L values, where L is an integer greater than one, wherein the differential sequence output by the LUT includes successive sequences of the L values, and wherein the up-sampling holder circuit includes a 1:M up-sampling ratio, where M is an integer greater than L.

12. The processing system of claim 11, wherein the coefficients include successive sequences of N=L*M values.

13. The processing system of claim 11, wherein the coefficient generator circuit further includes a normalizer circuit configured to normalize the coefficients output by the accumulator, the normalizer circuit including at least one of:
a bit-shifter circuit coupled to output of the accumulator; and
a multiplier circuit coupled to output of the bit-shifter circuit.

14. The processing system of claim 10, wherein the plurality of receivers is coupled to a plurality of sensor electrodes of an input device, and wherein each of the plurality of receivers is configured to measure charge or current on a respective one of the plurality of sensor electrodes.

15. The processing system of claim 14, further comprising a processor configured to process outputs of the plurality of FIR filters.

16. A method of generating coefficients for a filter having at least one stage, the method comprising:
outputting, by a look-up table (LUT), values of a differential sequence;
up-sampling and holding, by an up-sampling circuit, the values of the differential sequence to generate an up-sampled differential sequence; and
integrating, by an accumulator, the up-sampled differential sequence to generate the coefficients.

17. The method of claim 16, wherein the differential sequence includes L values, where L is an integer greater than one, wherein the values of the differential sequence include successive sequences of the L values, and wherein the up-sampled differential sequence is generated using a 1:M up-sampling ratio, where M is an integer greater than L.

18. The method of claim 17, wherein the coefficients include successive sequences of N=L*M values.

19. The method of claim 16, further comprising:
normalizing the coefficients output by the accumulator.

20. The method of claim 19, wherein the step of normalizing comprises:
performing at least one of bit-shifting and multiplication of the coefficients output by the accumulator.

* * * * *